(12) United States Patent
Yasuda et al.

(10) Patent No.: US 7,710,297 B2
(45) Date of Patent: May 4, 2010

(54) METHOD AND APPARATUS FOR ENTROPY CODING AND DECODING

(75) Inventors: Goki Yasuda, Kawasaki (JP); Takeshi Chujoh, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 12/255,475

(22) Filed: Oct. 21, 2008

(65) Prior Publication Data

US 2009/0096645 A1    Apr. 16, 2009

Related U.S. Application Data

(63) Continuation of application No. PCT/JP2007/058993, filed on Apr. 19, 2007.

(30) Foreign Application Priority Data

Apr. 21, 2006    (JP) ............................... 2006-118169

(51) Int. Cl.
*H03M 7/00* (2006.01)
(52) U.S. Cl. ..................... 341/107; 341/50; 341/51; 382/240; 382/237
(58) Field of Classification Search .............. 341/50, 341/51, 107; 382/240, 237
See application file for complete search history.

(56) References Cited

U.S. PATENT DOCUMENTS

| | | | | |
|---|---|---|---|---|
| 5,025,258 | A * | 6/1991 | Duttweiler | 341/107 |
| 5,210,536 | A | 5/1993 | Furian | |
| 5,357,250 | A * | 10/1994 | Healey et al. | 341/107 |
| 5,812,076 | A | 9/1998 | Yoshida | |
| 6,150,966 | A * | 11/2000 | Willems et al. | 341/107 |
| 6,373,988 | B1 | 4/2002 | Thorell et al. | |
| 6,876,773 | B2 * | 4/2005 | Mizuno et al. | 382/243 |
| 6,906,644 | B2 * | 6/2005 | Satoh | 341/51 |

FOREIGN PATENT DOCUMENTS

| | | |
|---|---|---|
| JP | 4-230518 A | 8/1992 |
| JP | 8-167853 A | 6/1996 |
| JP | 9-261075 A | 10/1997 |
| JP | 2001-525143 A | 12/2001 |

OTHER PUBLICATIONS

H. Cai, et al., "An Algorithm for Universal Lossless Compression with Side Information, 1996.12, IEEE Transactions on Information Theory", vol. 52, No. 9, pp. 4008-4016.

(Continued)

*Primary Examiner*—Jean B Jeanglaude
(74) *Attorney, Agent, or Firm*—Oblon, Spivak, McClelland, Maier & Neustadt, L.L.P.

(57) ABSTRACT

This apparatus includes a generator which generates a reference matrix having a correlation with an information matrix to be coded from the information matrix. A classifier classifies matrix components around the ith row component of the reference matrix, and generates a set of matrix components equal in distance from the ith row component. A calculator forms a context tree including a plurality of internal nodes corresponding to the matrix components of the set, and a plurality of branches and a plurality of leaf nodes which have one-to-one correspondence with the symbols of the components, associates a sequence of the symbols with a path extending from the leaf node to the root node of the context tree, and calculates the coding probability of the ith row/jth column component of the information matrix. A coder arithmetically codes the ith row/jth column component of the information matrix in accordance with the coding probability.

18 Claims, 8 Drawing Sheets

OTHER PUBLICATIONS

Frans M.J. Willems, et al., "The Context-Tree Weighting Method: Basic Properties", IEEE Transactions on Information Theory, vol. 41, No. 3, May 1995, pp. 653-664.

Toshiyasu Matsushima, et al., "A Bayes coding algorithm for FSM sources", IEEE Symposium on Information Theory, Sep. 1995, p. 388.

* cited by examiner

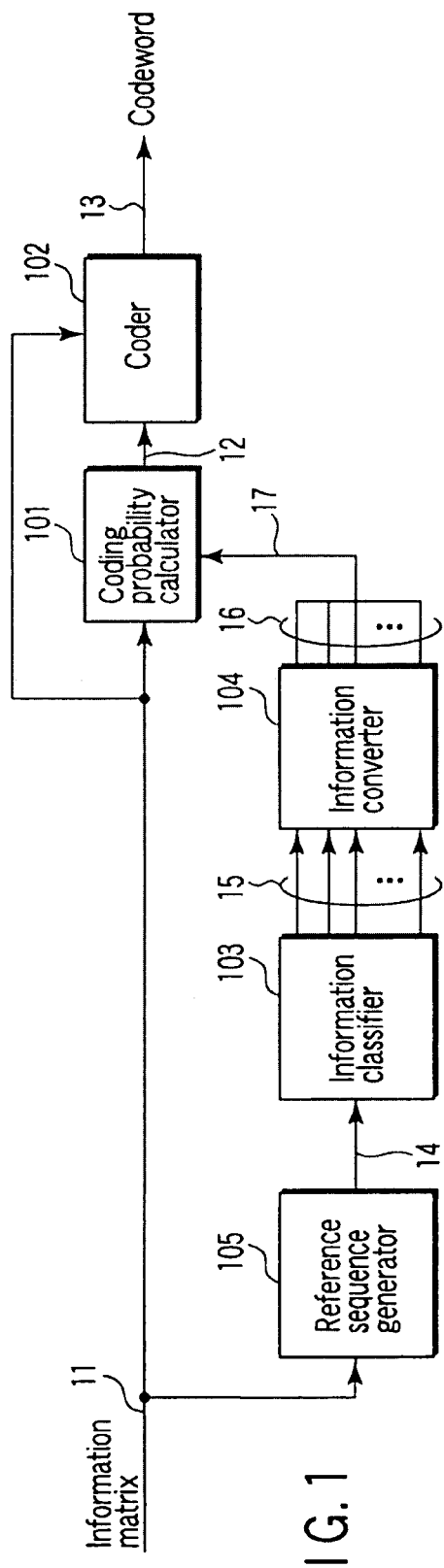
F I G. 1
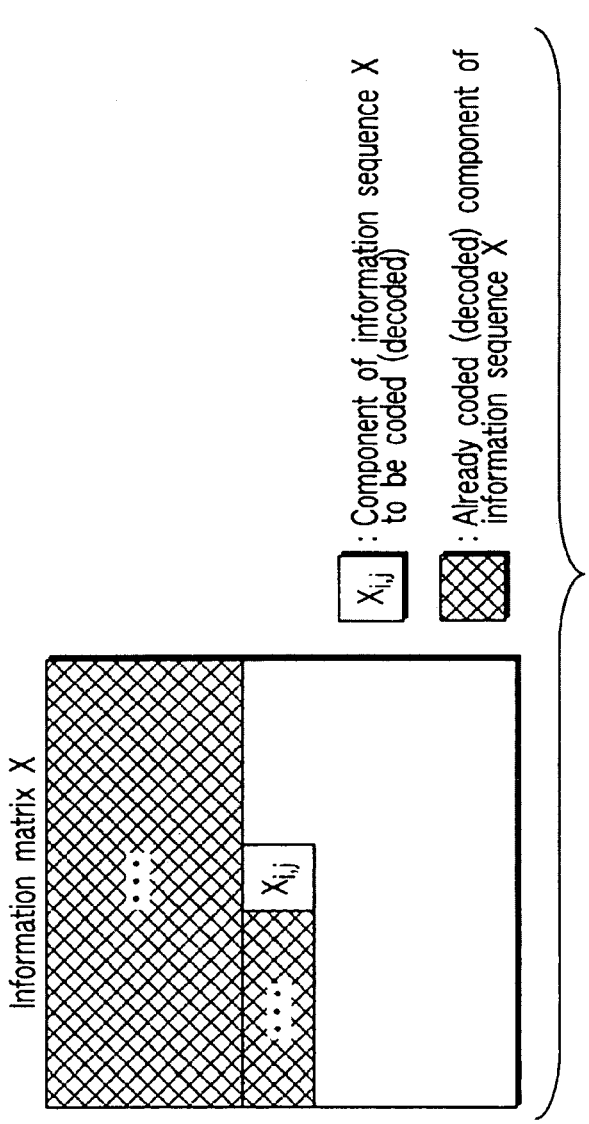
F I G. 2

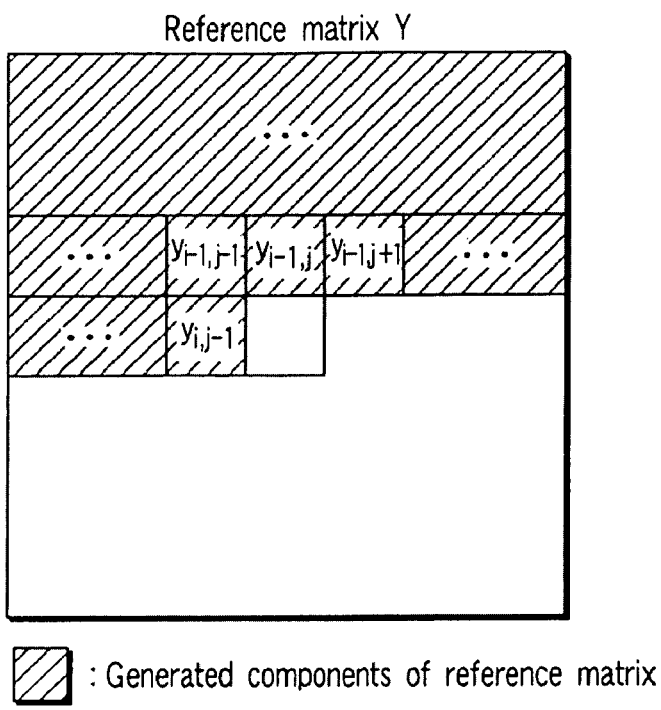
FIG. 3
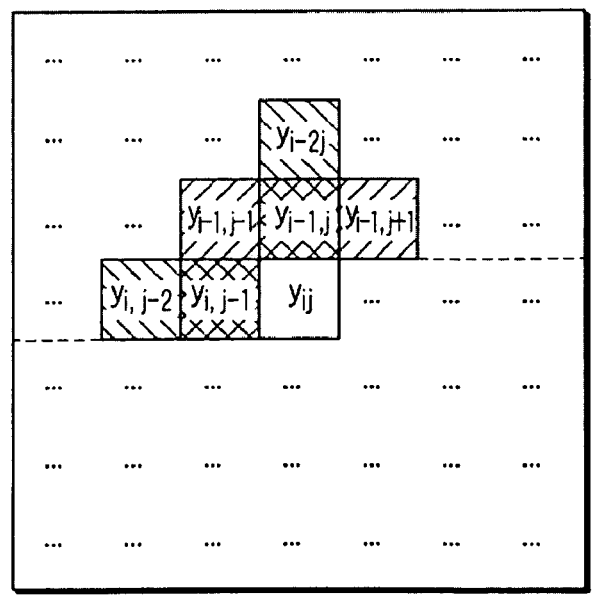
FIG. 4

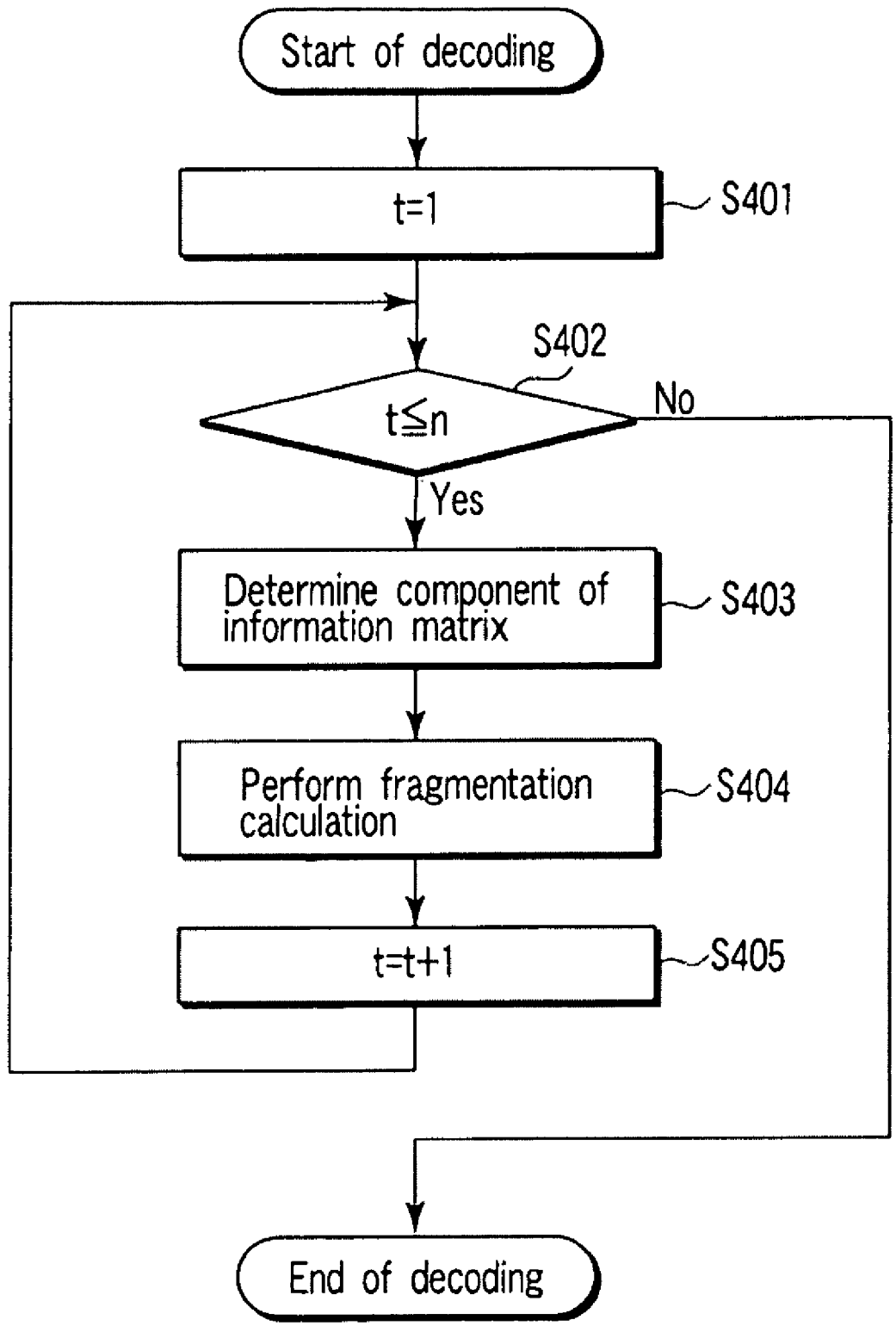
F I G. 11

METHOD AND APPARATUS FOR ENTROPY CODING AND DECODING

CROSS REFERENCE TO RELATED APPLICATIONS

This is a Continuation Application of PCT Application No. PCT/JP2007/058993, filed Apr. 19, 2007, which was published under PCT Article 21(2) in Japanese.

This application is based upon and claims the benefit of priority from prior Japanese Patent Application No. 2006-118169, filed Apr. 21, 2006, the entire contents of which are incorporated herein by reference.

BACKGROUND OF THE INVENTION

1. Field of the Invention

The present invention relates to method and apparatus for entropy coding and decoding.

2. Description of the Related Art

In entropy coding, it is necessary to obtain the coding probability of symbols to be coded. As a method of calculating a coding probability, there has been proposed a method of using a full tree (also called a context tree) which associates one-dimensional data sequences output in the past with paths from the leaf nodes to the root node. The method disclosed in F. M. J. Willems, Y. M. Shtarkov, and T. J. Tjalkens, "The Context Tree Weighting Method: Basic Properties", IEEE Trans. Inform. Theory, vol. 41, no. 3, pp. 653-664, May 1995 is called a context-tree weighting (CTW) algorithm. It is known that using the coding probability calculation method disclosed in this reference and T. Matsushima and S. Hirasawa, "A Bayes Coding Algorithm for FSM Sources", Proc. Int. Symp. on Information Theory pp. 388, September 1995 makes it possible to obtain a high coding efficiency with respect to a one-dimensional data sequence output of a Markov process.

Assume that two matrices, namely an information matrix as symbols to be coded and a reference matrix are given. In this case, as an application of entropy coding, it is conceivable to use a technique of coding or decoding components of an information matrix by using components of a reference matrix. When using a coding probability calculation method using a context tree for coding/decoding of matrix components in this manner, it is necessary to set a path from a leaf node of a context tree to a root node in accordance with the correlation between matrices. For example, regarding the pixel levels of two temporarily consecutive frames in a video sequence as an information matrix and a reference matrix, the correlation between a component of the information matrix and a component of the reference matrix generally increases with a decrease in the distance between the two matrix components. In this case, performing coding/decoding while associating a one-dimensional data sequence, in which a reference matrix is simply arranged in the raster scan order, i.e., the horizontal direction, with a path from a leaf node to a root node of a context tree amounts to performing coding/decoding without any consideration to the correlation between a component of an information matrix of interest and a component of a reference matrix arranged in the vertical direction. This is not preferable in terms of coding efficiency.

BRIEF SUMMARY OF THE INVENTION

It is an object of the present invention to form a context tree suitable for the correlation between an information matrix and a reference matrix and allow high-efficiency entropy coding and decoding by using the context tree.

According to a first aspect of the present invention, there is provided an entropy coding method comprising: generating a reference matrix containing matrix components from an information matrix, the reference matrix being coded so as to have a correlation with the information matrix; classifying the matrix components within a range around an i-th row/j-th column component (where $i$ and $j$ are arbitrary integers) of the reference matrix to component sets with reference to distances from the i-th row/j-th column component, the component sets each containing matrix components equal in distance from the i-th row/j-th column component of the reference matrix; converting the matrix components belonging to the each component set into symbols; forming a context tree including a root node, a plurality of internal nodes corresponding to the component sets, and a plurality of branches which have one-to-one correspondence with the symbols and a plurality of leaf nodes; associating a sequence obtained by arranging the symbols in descending order of distance between the i-th row/j-th column component of the reference matrix and the matrix components with a path extending from the leaf node to the root node of the context tree, and calculating a coding probability of the i-th row/j-th column component of the information matrix as a weighting sum of probabilities which the respective nodes hold; and generating a codeword by arithmetically coding the i-th row/j-th column component of the information matrix in accordance with the coding probability.

BRIEF DESCRIPTION OF THE SEVERAL VIEWS OF THE DRAWING

FIG. 1 is a block diagram showing an entropy coding apparatus according to an embodiment;

FIG. 2 is a view showing an example of an information matrix;

FIG. 3 is a view showing an example of a reference matrix;

FIG. 4 is a view showing an example of classification in an information classifier;

FIG. 11 is a flowchart showing an entropy decoding procedure in a decoder.

DETAILED DESCRIPTION OF THE INVENTION

Figure 5:
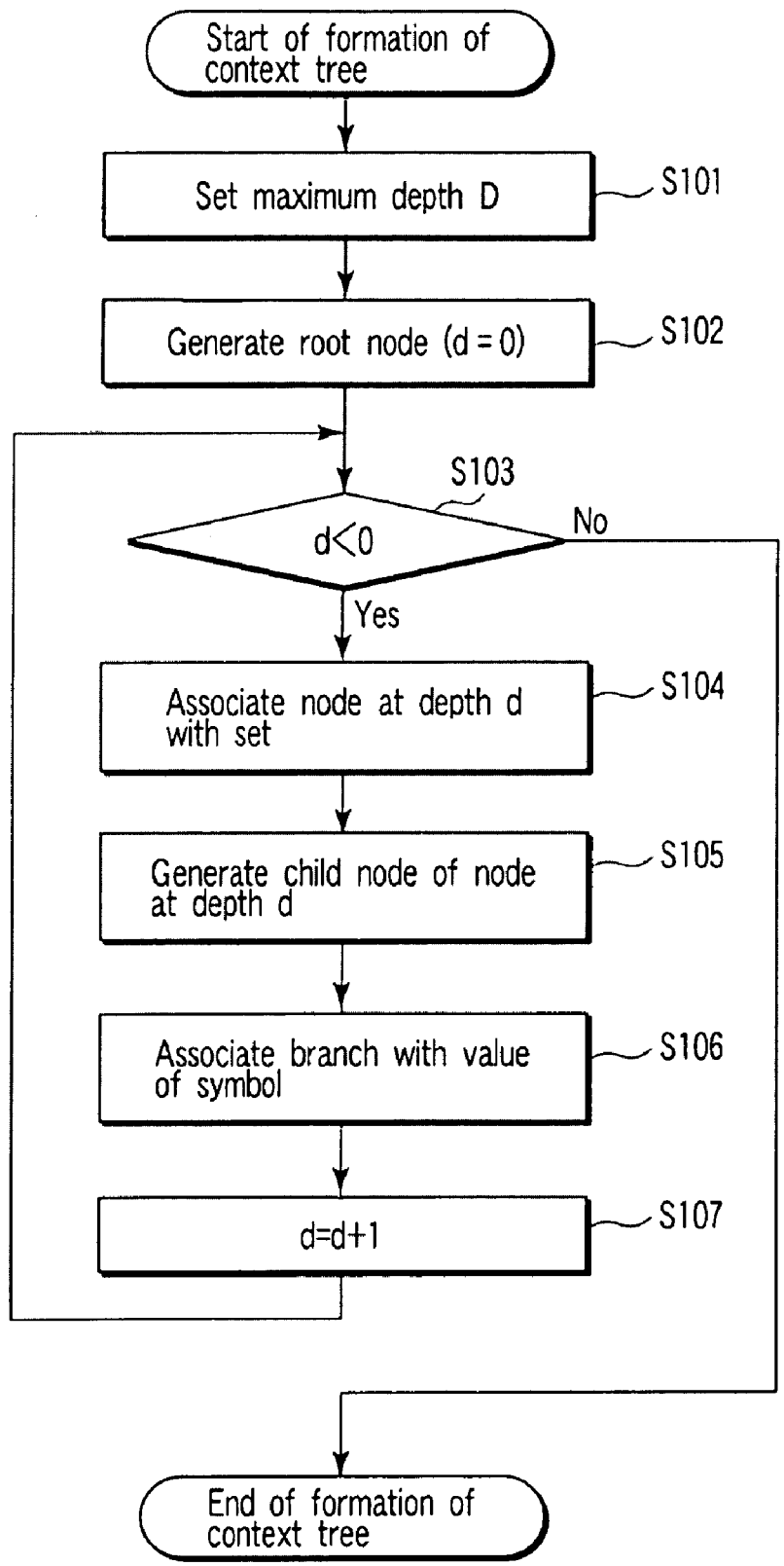
FIG. 5 is a flowchart showing a context tree forming procedure.

The embodiments of the present invention will be described below.

(Entropy Coding Apparatus)

As shown in FIG. 1, an entropy coding apparatus according to an embodiment includes a reference sequence generator 105, information classifier 103, information converter 104, coding probability calculator 101, and coder 102. The reference sequence generator 105, the coding probability calculator 101 and the coder 102 receive an information matrix 11 to be coded.

The reference sequence generator 105 is a memory which stores, for example, the coded components of an information matrix, and outputs already coded components of an information matrix as a reference matrix 14. The information classifier 103 forms a set 15 by classifying components within a predetermined range around the ith row/jth column component (where $\underline{i}$ and $\underline{j}$ are arbitrary integers) of the reference matrix 14 in accordance with a predetermined rule. In this specification, components of the information matrix 11 and reference matrix 14 are also called matrix components. The information converter 104 converts each matrix component of the set 15 into a symbol 16 in accordance with a predetermined operation. The coding probability calculator 101 calculates a coding probability 12 by using the ith row/jth column component of the information matrix 11 and a sequence 17 in which the symbol 16 output from the information converter 104 are arranged in descending order of the distance between the ith row/jth column component of the reference matrix and a corresponding component of the reference matrix. The coder 102 generates a codeword 13 of the ith row/jth column component of the information matrix 11 by arithmetic coding in accordance with the coding probability 12 which is calculated by, for example, the CTW algorithm.

Each component of the entropy coding apparatus in FIG. 1 will be described in detail below.

Assume that both the information matrix 11 and the reference matrix 14 are V rows×H columns matrices, and the distance between the $i_m$th row/$j_m$th column component and the $i_s$th row/$j_s$th column component is given by $$\sqrt{(i_m-i_s)^2+(j_m-j_s)^2} \quad (11)$$

Letting $\Xi$ and $\Psi$ respectively be sets of values which the information matrix 11 and the reference matrix 14 can take, $|\Xi|$ and $|\Psi|$ respectively be the numbers of elements of $\Xi$ and $\Psi$, and N be a total set of natural numbers equal to or greater than 1, the distance between the ith row/jth column component of the information matrix and a matrix component of the set 15 of the reference matrix 14 is given by $$\sqrt{(i-i_s)^2+(j-j_s)^2} \quad (12)$$

where $i_s$ and $j_s$ represent the row number and column number of the above matrix component, respectively.

The reference sequence generator 105 generates an already coded component of the information matrix 11 as a component of the reference matrix 14. Assume that the components of the information matrix 11 are coded in the raster scan order. In this case, the reference sequence generator 105 generates a component at a position corresponding to the already coded component of the reference matrix 14 by using an already coded component of the information matrix 11 in accordance with a predetermined rule. For example, as shown in FIG. 2, when coding an ith row/jth column component $x_{i,j}$ of the information matrix 11 as shown in FIG. 2, the reference sequence generator 105 generates a component of the reference matrix 14 as shown in FIG. 3.

The information classifier 103 classifies components within a predetermined range around the ith row/jth column component of the reference matrix 14 with reference to the distances from the ith row/jth column component, and forms the set 15 having components equal in distance from the ith row/jth column component. For example, as shown in FIG. 4, the information classifier 103 classifies the components within the range of the ith row/(j−1)th column, (i−1)th row/jth column, (i−1)th row/(j+1)th column, (I−1)th row/(j−1)th column, ith row/(j−2)th column, and (i−2)th row/jth column of the reference matrix 14 according to distances of 1, $\sqrt{2}$, and 2 from the ith row/jth column component to form three sets, i.e., a combination of the ith row/(j−1)th column component and the (i−1)th row/jth column component, a combination of the (i−1)th row/(j+1)th column component and the (i−1)th row/(j−1)th column component, and a combination of the ith row/(j−2)th column component and the (i−2)th row/jth column component.

This apparatus uses predetermined constants for components, of the ith row/(j−1)th column, (i−1)th row/jth column, (i−1)th row/(j+1)th column, (i−1)th row/(j−1)th column, ith row/(j−2)th column, and (i−2)th row/jth column components, which fall outside the range of the reference matrix 14. If, for example, h, v∈N, h<0 or h>H, and v<0 or v>V, then $y_{v,h}=0$.

The information converter 104 converts each matrix component of the set 15 into the symbol 16 in accordance with a predetermined operation. Let $z_r$ be the symbol 16 obtained by converting a matrix component of a set, of the set 15 formed by the information classifier 103, which includes the rth nearest component to the ith row/jth column component, $Z_r$ be a set of values which $z_r$ can take, and $|Z_r|$ be the number of elements of $Z_r$. Consider, for example, a case wherein the information converter 104 converts a matrix component of the following set:

$$G=\{y_g \in \Psi | g \in Z, 0 \leq g \leq |G|-1\} \quad (13)$$

which is classified by the information classifier 103 into $$\sum_{g=0}^{|G|-1} y_g \quad (14)$$

In this case, the information converter 104 generates symbols $z_1$, $z_2$ and $z_3$ by performing the following operation for a combination of an ith row/(j−1)th column component $y_{i,j-1}$ and an (i−1)th row/jth column component $y_{i-1,j}$, a combination of an (i−1)th row/(j+1)th column component $y_{i-1,j+1}$ and an (i−1)th row/(j−1)th column component $y_{i-1,j-1}$, and a combination of an ith row/(j−2)th column component $y_{i,j-2}$ and an (i−2)th row/jth column component $\underline{v}$.

$$z_1=y_{i,j-1}+y_{i-1,j} \quad (15.1)$$

$$z_2=y_{i-1,j+1}+y_{i-1,j-1} \quad (15.2)$$

$$z_3=y_{i,j-2}+y_{i-2,j} \quad (15.3)$$

When converting a matrix component of a set G into $$\sum_{g=0}^{|G|-1} y_g |\Psi|^g \quad (16)$$

the information converter 104 generates symbols $z_1$, $z_2$, and $z_3$ by performing the operation represented by the following equations:

$$z_1=y_{i,j-1}+y_{i-1,j} \times |\Psi|$$

$$z_2=y_{i-1,j+1}+y_{i-1,j-1} \times |\Psi|$$

$$z_3=y_{i,j-2}+y_{i-2,j} \times |\Psi| \quad (17)$$

The coding probability calculator 101 calculates a coding probability by using the ith row/jth column component of the information matrix 11, the sequence 17 of the symbols 16 output from the information converter 104, and a context tree formed in advance. That is, the coding probability calculator 101 associates a sequence in which the symbols 16 are arranged in descending order of the distance between the ith row/jth column component of the reference matrix 14 and the matrix components of the set G with paths from the leaf nodes to the root node of a context tree, and calculates the coding probability of the ith row/jth column component of the information matrix 11 as the weighting sum of probabilities which the respective nodes hold.

A context tree forming method will be described below with reference to FIGS. 5, 6, and 7. The flowchart of FIG. 5 shows a context tree forming procedure.

First of all, in step S101, this apparatus sets a maximum depth D of a context tree. Specifically, the maximum depth D is set to be equal to the number of sets 15 formed by the information classifier 103.

In step S102, the apparatus generates a root node of the content tree. In this case, letting $\underline{d}$ be a counter representing a depth and = be an assignment operator, d=0.

In step S103, the apparatus determines whether $\underline{d}$ is smaller than the maximum depth D. If $\underline{d}$ is smaller than D, the apparatus performs the processing in step S104. Otherwise, the apparatus terminates the formation of the context tree.

In step S104, the apparatus associates a node at the depth $\underline{d}$ with a set, of the sets 15 formed by the information classifier 103, which includes the (d+1)th nearest component to the ith row/jth column component.

In step S105, the apparatus generates branches extending from the node at the depth $\underline{d}$ and child nodes. In this case, the number of branches is set to be equal to a number $|Z_d|$ of values which symbols obtained by converting components of a set corresponding to the node at the depth $\underline{d}$ can take.

In step S106, the branches generated in step S105 are associated in one-to-one correspondence with the symbols obtained by converting the components of the set corresponding to the node at the depth $\underline{d}$.

In step S107, d=d+1 is set. The process then returns to step S103.

The above processing makes it possible to associate the sequences 17 of the symbols 16 output from the information converter 104 in one-to-one correspondence with paths from the leaf nodes of the context tree to the root node. For example, with regard to a component $y_{v,h}$ (h, v∈N, 1≦h≦H, 1≦v≦V) of a reference matrix, $y_{v,h}$∈{0, 1} is set. The information classifier 103 forms sets by classifying the components within the range of the ith row/(j−1)th column, (i−1)th row/jth column, (i−1)th row/(j+1)th column, (i−1)th row/(j−1)th column, ith row/(j−2)th column, and (i−2)th row/jth column of the reference matrix.

Figure 6:
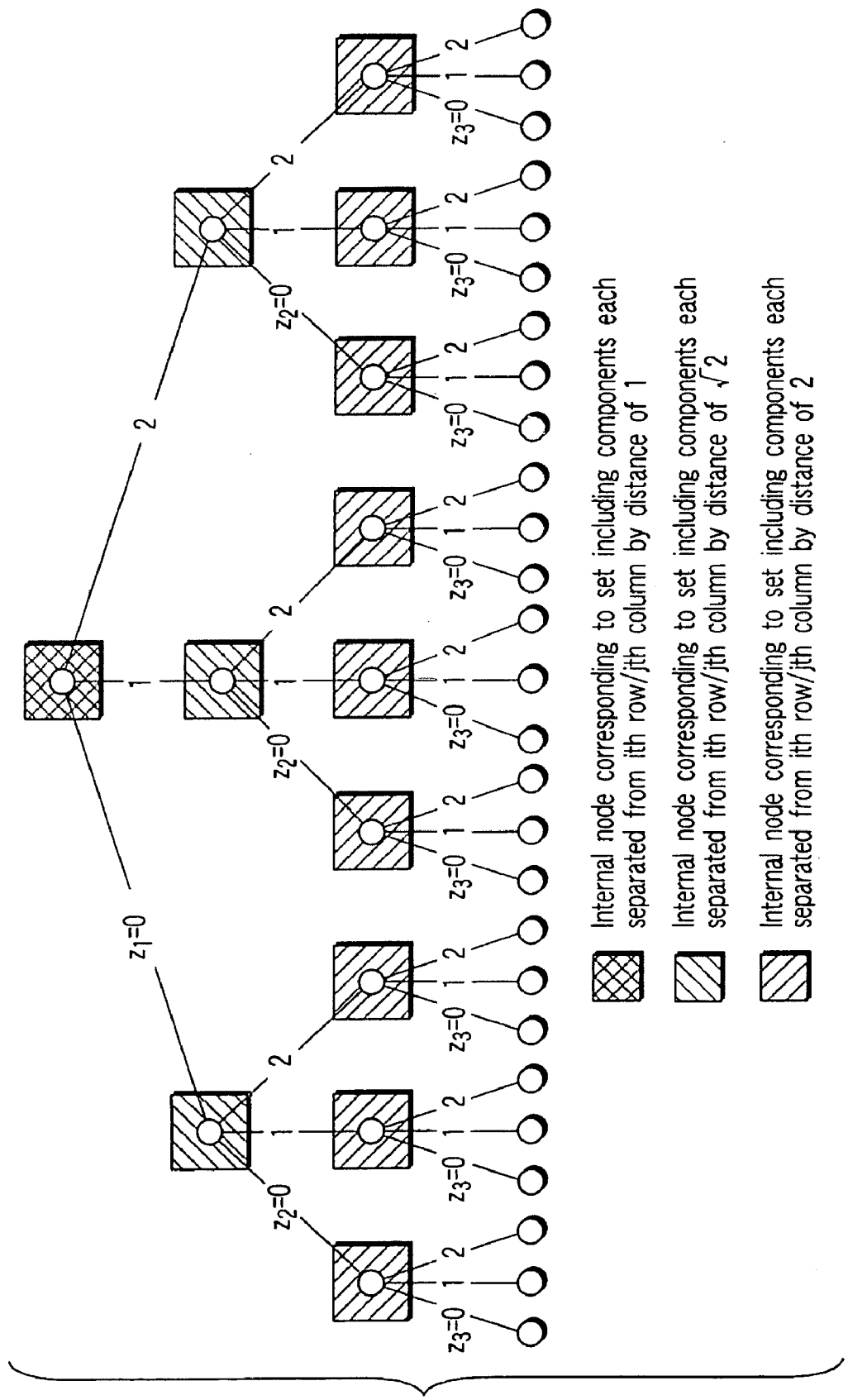
FIG. 6 is a view showing an example of a context tree.
Figure 7:
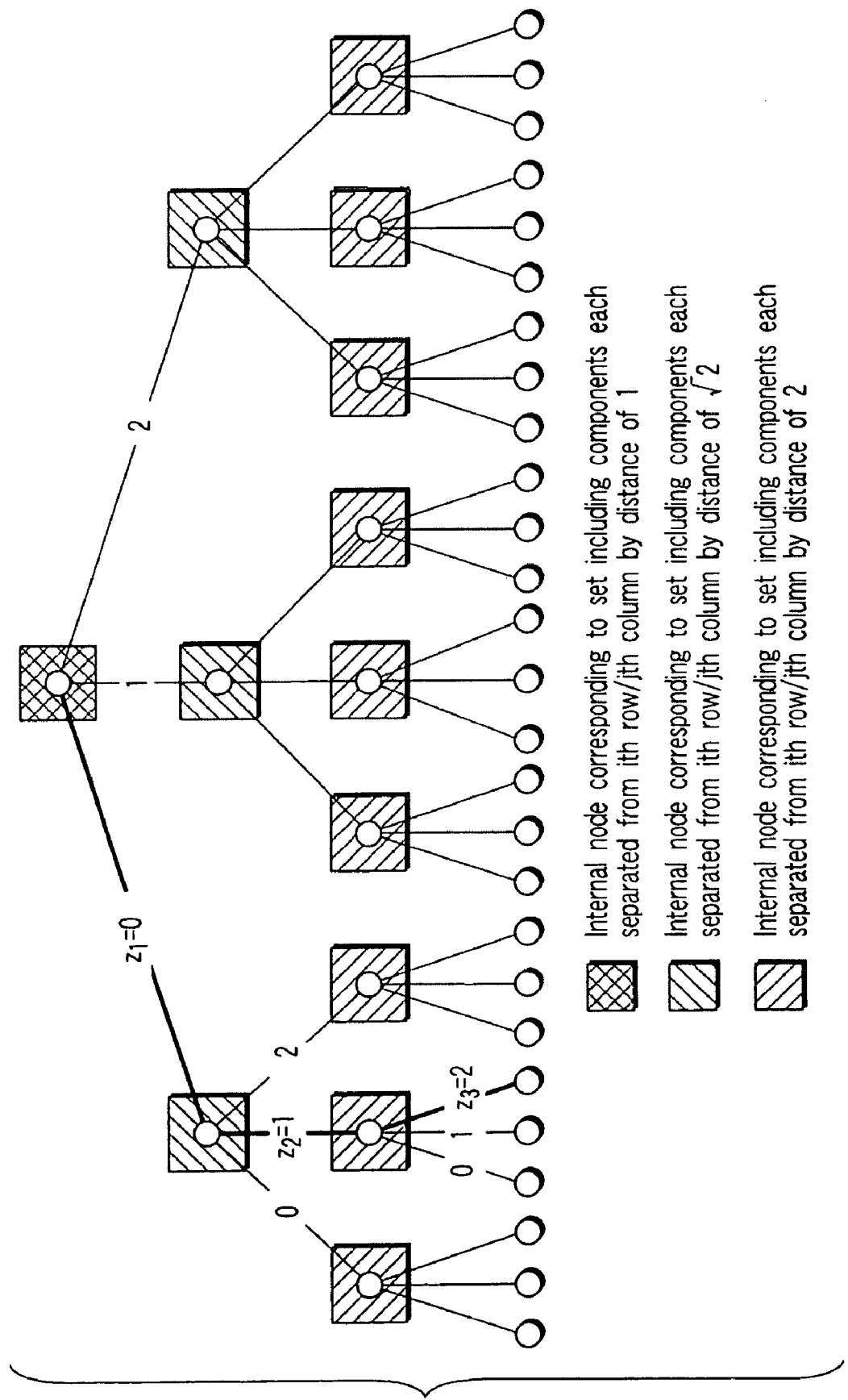
FIG. 7 is a view showing an example of how symbol sequences are associated with paths from the leaf nodes to the root node of the context tree in FIG. 6.

When converting the components of the respective sets according to equations (15.1), (15.2), and (15.3), the coding probability calculator 101 obtains a context tree like that shown in FIG. 6. If, for example, the symbols 16 output from an information converter 104 are $z_1$=0, $z_2$=1, and $z_3$=2, $z_3$ $z_2$ $z_1$=210 which is the sequence 17 of the symbols 16 as shown in FIG. 7 corresponds to a path from a leaf node to the node root of the context tree, which is drawn with the thick line in FIG. 7. As is understood from this example, in the sequence 17, the symbols 16 are arranged in descending order of the distance between the ith row/jth column component of the reference matrix 14 and a corresponding matrix component of the set 15. That is, the symbols 16 are sequentially arranged starting from a symbol corresponding to a set including a matrix component at the most distant position from the ith row/jth column component of the reference matrix 14.

Figure 8:
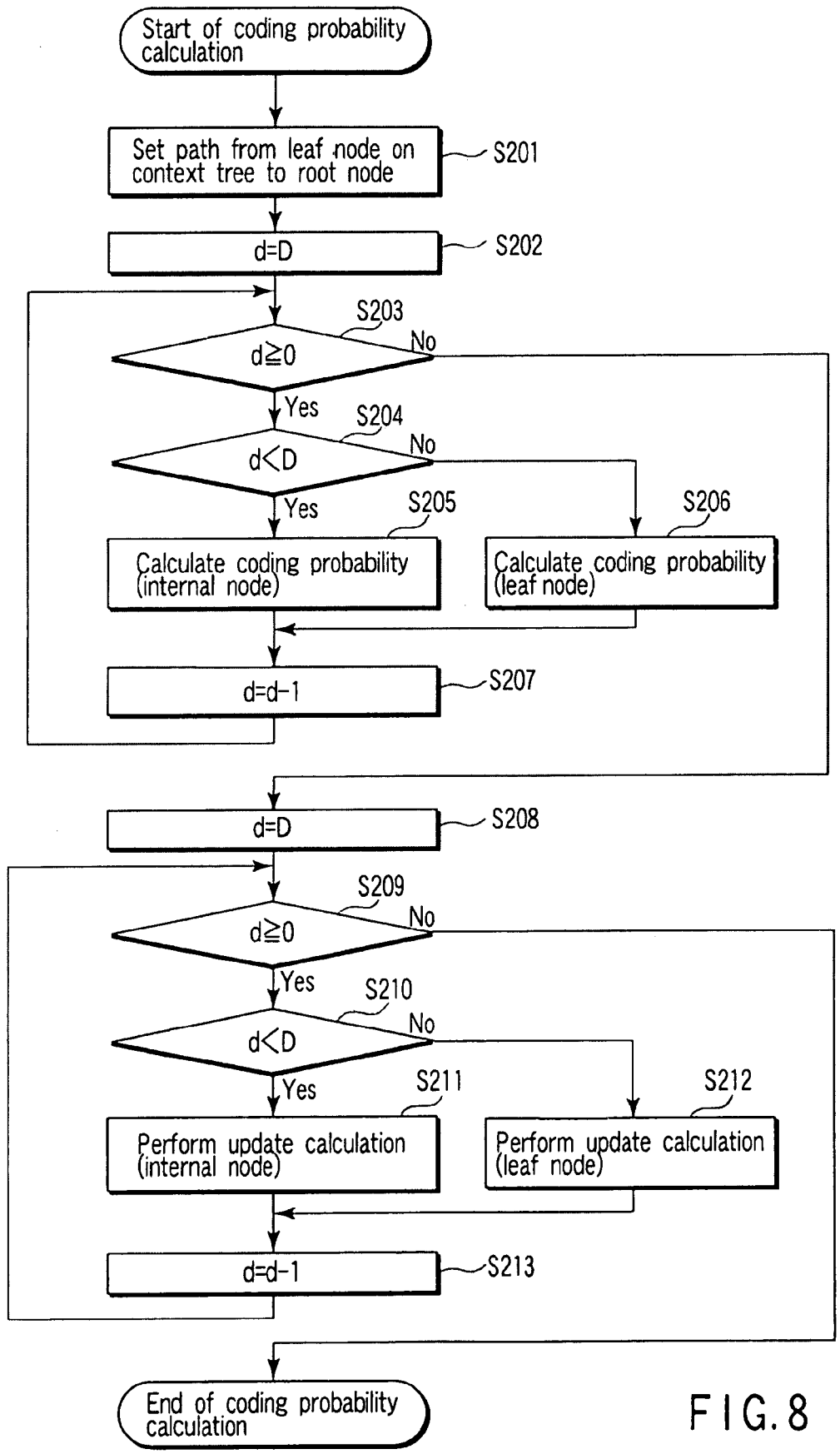
FIG. 8 is a flowchart showing a coding probability calculation procedure.

A procedure of calculating a coding probability by using a context tree formed in this manner according to the CTW algorithm will be described next. When obtaining the coding probability of the ith row/jth column component of an information matrix, this apparatus can perform coding probability calculation by using T. Matsushima and S. Hirasawa, "A Bayes Coding Algorithm for FSM Sources", Proc. Int. Symp. on Information Theory pp. 388, September 1995, the entire contents of which are incorporated herein by reference. A procedure of performing coding probability calculation in the raster scan order will be described below with reference to FIG. 8.

Let $x_t$ be the tth component of an information matrix in the raster scan order. With regard to a context tree, $q_t(s)$, $p_{t,s}(x|s)$, $p_{t,m}(x|s)$, $n_t(x|s)$, $\alpha(x|s)(x\in\Xi)$ is made to correspond to an arbitrary node $\underline{s}$ if it is an internal node. $p_{t,s}(x|s)$, $p_{t,m}(x|s)$, $n_t(x|s)$, $\alpha(x|s)(x\in\Xi)$ is made to correspond to the node $\underline{s}$ if it is a node.

In step S201, this apparatus associates a sequence $z_D z_{D-1} \ldots z_1$ comprising symbols $z_d$ (1≦d≦D) output from the information converter 104 with a path from a node on the context tree to the root node.

In step S202, the apparatus initializes the counter $\underline{d}$ representing a depth by the following equation.

$$d=D \qquad (*)$$

In step S203, it is determined whether $\underline{d}$ is equal to or greater than zero. If YES in step S203, the apparatus performs the processing in step S204. If NO in step S203, the apparatus performs the processing in step S208.

In step S204, it is determined whether $\underline{d}$ is smaller than the maximum depth D. If YES in step S204, the apparatus performs the processing in step S205. If NO in step S204, the apparatus performs the processing in step S206.

In step S205, the apparatus performs the following calculation with respect to a node $s_d$ at the depth d on the path set in step S201.

$$P_{t,s}(x \mid s_d) = \frac{n_t(x \mid s_d) + \alpha(x \mid s_d)}{\sum_x (n_t(x \mid s_d) + \alpha(x \mid s_d))}$$

$(x \in \Xi)$ $$P_{t,m}(x \mid s_d) = q_t(s_d)P_{t,s}(x \mid s_d) + (1 - q_t(s_d))P_{t,m}(x \mid s_{d+1})$$

$(x \in \Xi)$ where:

$n_1(x|s_d)=0 (x\in\Xi)$ $q_1(s_d)=\frac{1}{2}$ $\alpha(x|s_d)=\frac{1}{2}(x\in\Xi)$ \hfill (18)

In step S206, the apparatus calculates the following calculation with respect to the node $s_d$ at the depth $\underline{d}$ on the path set in step S201.

$$P_{t,s}(x \mid s_d) = \frac{n_t(x \mid s_d) + \alpha(x \mid s_d)}{\sum_x (n_t(x \mid s_d) + \alpha(x \mid s_d))}$$

$(x \in \Xi)$ $$P_{t,m}(x \mid s_d) = P_{t,s}(x \mid s_d)$$

$(x \in \Xi)$ where:

$$n_1(x|s_d) = 0 (x \in \Xi)$$

$$\alpha(x|s_d) = 1/2 (x \in \Xi) \qquad (19)$$

In step S207, d=d−1 is set.

In step S208, the apparatus initializes the counter d representing a depth by the equation (*) again.

In step S209, it is determined whether d is equal to or greater than zero. If YES in step S209, the apparatus performs the processing in step S210. If NO in step S209, the apparatus terminates the CTW algorithm.

In step S210, it is determined whether d is smaller than D. If YES in step S210, the apparatus performs the processing in step S211. If NO in step S210, the apparatus performs the processing in step S212.

In step S211, the apparatus performs the following calculation with respect to the node $s_d$ at the depth d on the path set in step S201.

$$n_{t+1}(x|s_d) = \begin{cases} n_t(x|s_d) + 1 & x = x_t \\ n_t(x|s_d) & x \neq x_t \end{cases} \qquad (20)$$

$$q_{t+1}(s_d) = \frac{q_t(s_d) P_{t,s}(x|s_d)}{q_t(s_d) P_{t,s}(x|s_d) + (1 - q_t(s_d)) P_{t,m}(x_t|s_{d+1})}$$

The apparatus performs the calculation of equation (20) with respect to all $x \in \Xi$.

In step S212, the apparatus performs the following calculation with respect to the node $s_d$ at the depth d on the path set in step S201.

$$n_{t+1}(x|s_d) = \begin{cases} n_t(x|s_d) + 1 & x = x_t \\ n_t(x|s_d) & x \neq x_t \end{cases} \qquad (21)$$

The apparatus performs the calculation of equation (21) with respect to all $x \in \Xi$.

In step S213, d=d−1 is set.

The apparatus performs the above processing and regards the following value corresponding to a root node $s_0$ as a coding probability.

$$P_{t,m}(x|s_0) \qquad (22)$$

The coder 102 generates a codeword by performing arithmetic coding, i.e., entropy coding (variable-length coding), with respect to the ith row/jth column component of the information matrix 11 in accordance with the coding probability calculated in this manner. That is, the coder 102 generates a codeword corresponding to the ith row/jth column component of the information matrix 11 by an entropy coding technique of controlling the codeword length in accordance with the coding probability. In other words, the coder 102 generates a codeword corresponding to the ith row/jth column component of the information matrix 11 by performing arithmetic computation based on addition, subtraction, multiplication, division, or bit processing computation in accordance with the coding probability. In addition, the coder 102 fragments an interval on a number line into small sections each of which has a width corresponding to the coding probability of a sequence and is associated with the sequence, and expresses one point in a small section corresponding to a sequence to be coded as a codeword, thereby generating a codeword corresponding to the ith row/jth column component of the information matrix 11.

Figure 9:
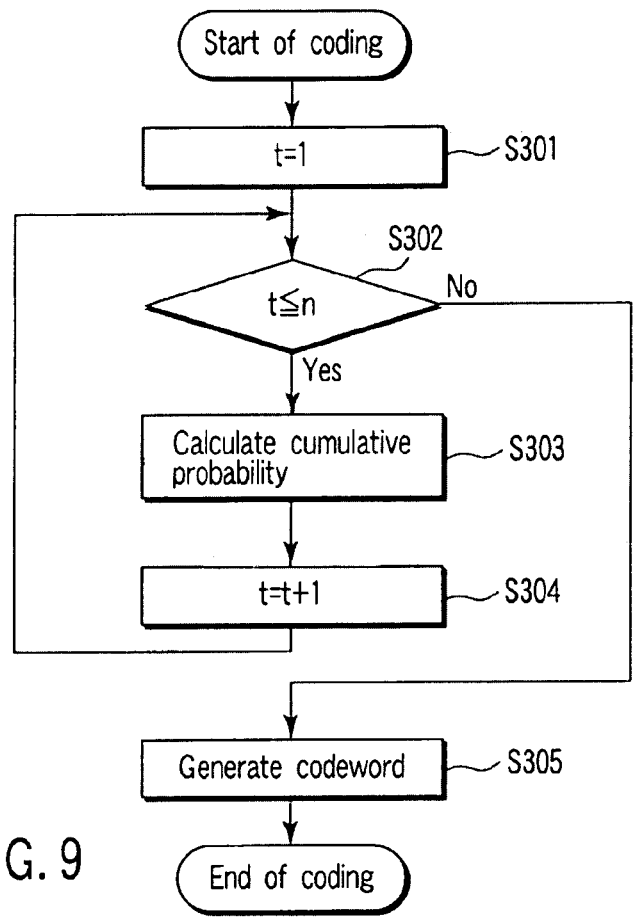
FIG. 9 is a flowchart showing an entropy coding procedure in a coder.

A case wherein the codes of the information matrix 11 are coded in the raster scan order to generate binary codewords (variable-length codes) will be described below with reference to FIG. 9.

Let n be the number of components of the information matrix 11 and reference matrix 14, $x^t$ be the first to tth sequences in the raster scan order, and $x^0$ be a null sequence. The number of components of a matrix is given by n=H×V.

In step S301, the value of the counter is set to t=1.

In step S302, it is determined whether t is equal to or smaller than n. If YES in step S302, the apparatus performs the processing in step S303. If NO in step S302, the apparatus performs the processing in step S305.

In step S303, the apparatus performs the following calculation in binary notation.

$$T(x^{t-1}x) = \lfloor T(x^{t-1}) P_{t,m}(x|s_0) \rfloor_\omega \qquad (23)$$

$$(x \in \Xi)$$

$$F(x^t) = F(x^{t-1}) + \sum_{x' < x} T(x^{t-1}x')$$

where $\lfloor \ \rfloor_\omega$ indicates that binary floating-point representation is truncated to ω digits.

Assume that $F(x^0)$ and $T(x^0)$ are set to $F(x^0)=0$ and $T(x^0)=1$.

In step S304, t=t+1 is set.

In step S305, the apparatus generates a codeword by sequentially arranging values from the first decimal place of $F(x^n)$ calculated in the preceding processing to the least significant digit upon addition based on mathematical expression (23).

As described above, the entropy coding apparatus can form a context tree suitable for the correlation between an information sequence and a reference matrix, and hence improves coding efficiency as compared with the case of simply associating a one-dimensional data sequence in which a reference matrix is simply arranged in the raster scan order with a path from a leaf node of a context tree to the root node.

(Entropy Decoding Apparatus)

Figure 10:
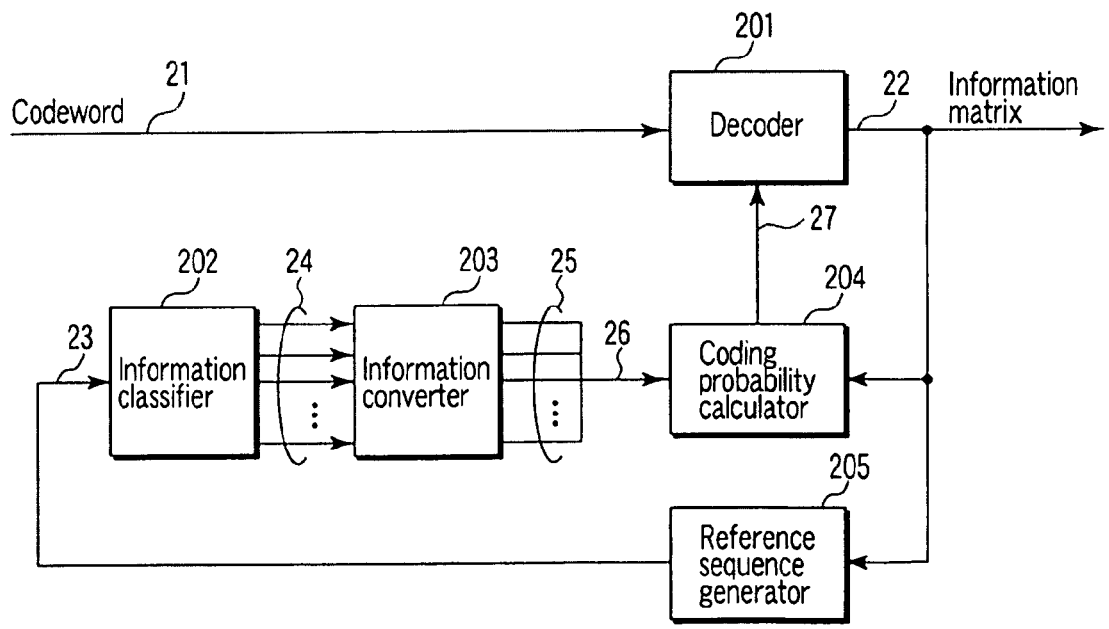
FIG. 10 is a block diagram of an entropy decoding apparatus according to an embodiment.

An entropy decoding apparatus corresponding to the above entropy coding apparatus will be described next. As shown in FIG. 10, the entropy decoding apparatus according to an embodiment includes a decoder 201, information classifier 202, information converter 203, coding probability calculator 204, and reference sequence generator 205. The decoder 201 receives a codeword (variable-length code) 21 to be decoded. The decoder 201 generates an information matrix 22 by entropy-decoding the codeword 21.

The reference sequence generator 205 is a memory which stores, for example, a decoded component of an information matrix, and outputs an already decoded component of an information matrix as a reference matrix 23. The information classifier 202 forms a set 24 by classifying components within a predetermined range around the ith row/jth column component (where i and j are arbitrary integers) of the reference matrix 23 in accordance with a predetermined rule. In this specification, components of the information matrix 22 and reference matrix 23 are also called matrix components. The information converter 203 converts each matrix component of the set 24 into a symbol 25 in accordance with a predetermined operation. The coding probability calculator 204 calculates a coding probability 27 by using the ith row/jth column component of the information matrix 11 and a sequence 26 in which the symbol 25 output from the information converter 203 are arranged in descending order of the distance between the ith row/jth column component of the reference matrix and a component of the reference matrix. The decoder 201 generates the information matrix 22 by entropy-decoding the codeword 21 in accordance with the coding probability 27 calculated by, for example, the CTW algorithm. The reference sequence generator 205 and the coding probability calculator 204 receive the ith row/jth column component of the information matrix 22.

Each component of the entropy decoding apparatus in FIG. 10 will be described in detail below.

A case wherein the entropy coding apparatus shown in FIG. 1 codes the components of an information matrix in the raster scan order will be described. The reference sequence generator 205 generates a component of the reference matrix 23 from a component of the information matrix 22, which is obtained by decoding the codeword 21, in accordance with a predetermined rule. The rule based on which the reference matrix 23 is generated from components of the information matrix 22 is the same as the rule based on which the reference sequence generator 105 in the entropy coding apparatus shown in FIG. 1 generates the reference matrix 14 from components of the information matrix 11.

The information classifier 202, information converter 203, and coding probability calculator 204 each perform the same processing as that performed by a corresponding one of the information classifier 103, information converter 104, and coding probability calculator 101 in the entropy coding apparatus shown in FIG. 1. The information classifier 202 classifies components within a predetermined range around the ith row/jth column component of the reference matrix 23, e.g., the components within the range of the ith row/(j−1)th column, (i−1)th row/jth column, (i−1)th row/(j+1)th column, (i−1)th row/(j−1)th column, ith row/(j−2)th column, and (i−2)th row/jth column of the reference matrix 22 shown in FIG. 4, with reference to the distances from the ith row/jth column component, and forms the set 24 having components equal in distance from the ith row/jth column component. Assume that a predetermined range around the ith row/jth column component of the reference matrix 23 is set in advance, which is common to the entropy coding apparatus. In addition, with regard to components, of the ith row/(j−1)th column, (i−1)th row/jth column, (i−1)th row/(j+1)th column, (i−1)th row/(j−1)th column, ith row/(j−2)th column, and (i−2)th row/jth column components, which fall outside the range of the reference matrix 23, constants to be applied are set in advance so as to be common to those in the entropy coding apparatus shown in FIG. 1.

The information converter 203 converts each matrix component of the set 24 into the symbol 25 in accordance with the same operation as that performed by the information converter 104 in the entropy coding apparatus shown in FIG. 1, e.g., the operation based on mathematical expressions (12) to (17), and outputs the sequence 26 of the symbols 25. The coding probability calculator 204 calculates a coding probability by using the sequence 26 of the symbols 25 from the information converter 203 and a context tree formed in advance. The context tree forming method and the coding probability calculation method based on it which are used in this case are the same as those used by the coding probability calculator 101 in the entropy coding apparatus shown in FIG. 1.

The decoder 201 entropy-decodes (variable-length decodes) the codeword 21 in accordance with the coding probability 27 to reconstruct the ith row/jth column component of the information matrix 22. The procedure executed by the decoder 201 will be described with reference to FIG. 11 by exemplifying the case of decoding the codeword generated by the entropy coding apparatus shown in FIG. 1.

In step S401, the decoder 201 sets a counter value $t$ to t=1.

In step S402, the decoder 201 determines whether the counter value $t$ is equal to or smaller than $n$. If YES in step S402, the decoder 201 performs the processing in step S403. If NO in step S402, the decoder 201 terminates the decoding operation.

In step S403, the decoder 201 decodes a component $x_t$ of an information matrix which corresponds to the tth place in the raster scan order according to the following equation. Assume that the decoder 201 is to perform calculation in binary notation.

$$T(x^{t-1}x) = \lfloor T(x^{t-1})P_{t,m}(x \mid s_0) \rfloor_\omega \qquad (24)$$

$$(x \in \Xi)$$

$$x_t = \max\left\{ x \in \Xi \;\middle|\; \sum_{x' < x} T(xt - 1x') \le W_{t-1} \right\}$$

where $W_0 = F(x^n)$.

In step S404, the decoder 201 sets $$W_t = W_{t-1} - \sum_{x' < x} T(x^{t-1}x') \qquad (25)$$

In step S405, the decoder 201 sets t=t+1. The process returns to step S402.

Another embodiment of the present invention will be described next. The above embodiment uses the memory storing a coded information sequence or a decoded information sequence as a reference sequence generator. The above description has exemplified the case wherein an information sequence to be coded or an information sequence obtained by decoding a codeword and a reference sequence are the same sequence, i.e., the reference sequence is an information sequence which has already been coded or decoded. However, a reference sequence need not be the same sequence as an information sequence, and may be a sequence having a correlation with an information sequence.

Application examples of the entropy coding apparatus and entropy decoding apparatus according to the embodiment will be described next. For example, a video coding/decoding apparatus uses entropy coding/decoding. The video coding apparatus divides one frame of a video sequence into blocks, and orthogonally transforms the pixel levels of an input video sequence or prediction residue for each block by discrete cosine transform (DCT) or the like, thereby generating orthogonal transformation coefficients. This apparatus quantizes orthogonal transformation coefficients and entropy-codes the quantized orthogonal transformation coefficients.

Such a video coding apparatus may use a method of sending, as information for determining whether all the quantized orthogonal transformation coefficients contained in each block are zero, a value of 0 when all the coefficients are zero, and a value of 1 when all the coefficients are not zero, and sending the values of the quantized orthogonal transformation coefficients only when the value of the flag is 1. In this case, the apparatus generates an information sequence by arranging pieces of information, each indicating whether all the quantized orthogonal transformation coefficients contained in each block are zero, in accordance with the positions of the blocks of one frame. The entropy coding apparatus according to an embodiment is suitable for entropy-coding such an information sequence. In addition, the entropy decoding apparatus according to an embodiment is suitable for decoding the codeword generated by the above operation to reproduce the original information sequence.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An entropy coding method comprising:
    generating a reference matrix containing matrix components from an information matrix, the reference matrix being coded so as to have a correlation with the information matrix;
    classifying the matrix components within a range around an i-th row/j-th column component (where $\underline{i}$ and $\underline{j}$ are arbitrary integers) of the reference matrix to component sets with reference to distances from the i-th row/j-th column component, the component sets each containing matrix components equal in distance from the i-th row/j-th column component of the reference matrix;
    converting the matrix components belonging to the each component set into symbols;
    forming a context tree including a root node, a plurality of internal nodes corresponding to the component sets, and a plurality of branches which have one-to-one correspondence with the symbols and a plurality of leaf nodes;
    associating a sequence obtained by arranging the symbols in descending order of distance between the i-th row/j-th column component of the reference matrix and the matrix components with a path extending from the leaf node to the root node of the context tree, and calculating a coding probability of the i-th row/j-th column component of the information matrix as a weighting sum of probabilities which the respective nodes hold; and
    generating a codeword by arithmetically coding the i-th row/j-th column component of the information matrix in accordance with the coding probability.

2. An entropy coding apparatus comprising:
    a generator which generates a reference matrix containing matrix components from an information matrix, the reference matrix being coded so as to have a correlation with the information matrix;
    a classifier which classifies the matrix components within a range around an i-th row/j-th column component (where $\underline{i}$ and $\underline{j}$ are arbitrary integers) of the reference matrix to component sets with reference to distances from the i-th row/j-th column component, the component sets each containing matrix components equal in distance from the i-th row/j-th column component of the reference matrix;
    a converter which converts the matrix components belonging to the each component set into symbols;
    a calculator which forms a context tree including a root node, a plurality of internal nodes corresponding to the component sets, and a plurality of branches which have one-to-one correspondence with the symbols and a plurality of leaf nodes, associates a sequence obtained by arranging the symbols in descending order of distance between the i-th row/j-th column component of the reference matrix and the matrix components with a path extending from the leaf node to the root node of the context tree, and calculates a coding probability of the i-th row/j-th column component of the information matrix as a weighting sum of probabilities which the respective nodes hold; and
    a coder which generates a codeword by arithmetically coding the i-th row/j-th column component of the information matrix in accordance with the coding probability.

3. The apparatus according to claim 2, wherein the reference matrix generator generates an already coded information matrix as the reference matrix.

4. The apparatus according to claim 2, wherein the distance between the i-th row/j-th column component and the matrix component is defined by $$\sqrt{(i-i_s)^2+(j-j_s)^2}$$

where $i_s$ and $j_s$ represent a row number and column number of the matrix component, respectively.

5. The apparatus according to claim 2, wherein the classifier classifies components within a range of an i-th row/(j−1)-th column, (i−1)th row/j-th column, (i−1)th row/(j+1)-th column, (i−1)th row/(j−1)-th column, i-th row/(j−2)-th column, and (i−2)th row/j-th column of the reference matrix.

6. The apparatus according to claim 2, wherein defining a set of values which matrix components of the reference matrix are configured to take as $\Psi$, the number of elements of $\Psi$ as $|\Psi|$, $\Psi=\{0, 1, \ldots, |\Psi|-1\}$, a total set of integers as Z, and a set of matrix components equal in distance from the i-th row/j-th column component of the reference matrix as $$G=\{y_g \epsilon \Psi | g \epsilon Z, 0 \leq g \leq |G|-1\}$$

where |G| is the number of elements of the set G, the classifier converts a matrix component contained in the set G into a symbol given by $$\sum_{g=0}^{|G|-1} y_g.$$

7. The apparatus according to claim 2, wherein defining a set of values which matrix components of the reference matrix are configured to take as $\Psi$, the number of elements of $\Psi$ as $|\Psi|$, $\Psi=\{0, 1, \ldots, |\Psi|-1\}$, a total set of integers as Z, and a set of matrix components equal in distance from the i-th row/j-th column component of the reference matrix as $$G=\{y_g \epsilon \Psi | g \epsilon Z, 0 \leq g \leq |G|-1\}$$

where |G| is the number of elements of the set G, the classifier converts a matrix component contained in the set G into a symbol given by $$\sum_{g=0}^{|G|-1} y_g |\Psi|^g.$$

8. The apparatus according to claim 2, wherein the context tree has a depth equal to the number of sets generated by the classifier.

9. The apparatus according to claim 2, wherein the context tree makes an internal node at a shallower position have one-to-one correspondence with a matrix component of, a set generated by the classifier, which is nearer the i-th row/j-th column component of the reference matrix.

10. An entropy decoding method comprising:

generating a reference matrix containing matrix components from an information matrix, the reference matrix having a correlation with the information matrix, and the information matrix being generated by decoding a codeword;

classifying the matrix components within a range around an i-th row/j-th column component (where i and j are arbitrary integers) of the reference matrix to component sets with reference to distances from the i-th row/j-th column component, the component sets each containing matrix components equal in distance from the i-th row/j-th column component of the reference matrix;

converting the matrix components belonging to the each component set into symbols;

forming a context tree including a root node, a plurality of internal nodes corresponding to the component sets, and a plurality of branches which have one-to-one correspondence with the symbols and a plurality of leaf nodes;

associating a sequence obtained by arranging the symbols in descending order of distance between the i-th row/j-th column component of the reference matrix and the matrix components with a path extending from the leaf node to the root node of the context tree, and calculating a coding probability of the i-th row/j-th column component of the information matrix as a weighting sum of probabilities which the respective nodes hold; and generating the i-th row/j-th column component of the information matrix by decoding the codeword in accordance with the coding probability.

11. An entropy decoding apparatus comprising:

a generator which generates a reference matrix containing matrix components from an information matrix, the reference matrix having a correlation with the information matrix, and the information matrix being generated by decoding a codeword;

a classifier which classifies the matrix components within a range around an i-th row/j-th column component (where i and j are arbitrary integers) of the reference matrix to component sets with reference to distances from the i-th row/j-th column component, the component sets each containing matrix components equal in distance from the i-th row/j-th column component of the reference matrix;

a converter which converts the matrix components belonging to the component set into symbols;

a calculator which forms a context tree including a root node, a plurality of internal nodes corresponding to the component sets, and a plurality of branches which have one-to-one correspondence with the symbols and a plurality of leaf nodes, associates a sequence obtained by arranging the symbols in descending order of distance between the i-th row/j-th column component of the reference matrix and the matrix components with a path extending from the leaf node to the root node of the context tree, and calculates a coding probability of the i-th row/j-th column component of the information matrix as a weighting sum of probabilities which the respective nodes hold; and a decoder which generates the i-th row/j-th column component of the information matrix by decoding the codeword in accordance with the coding probability.

12. The apparatus according to claim 11, wherein the reference matrix generator generates an already coded information matrix as the reference matrix.

13. The apparatus according to claim 11, wherein the distance between the i-th row/j-th column component and the matrix component is defined by $$\sqrt{(i-i_s)^2+(j-j_s)^2}$$

where $i_s$ and $j_s$ represent a row number and column number of the matrix component, respectively.

14. The apparatus according to claim 11, wherein the classifier classifies components within a range of an i-th row/(j−1)-th column, (i−1)th row/j-th column, (i−1)th row/(j+1)-th column, (i−1)th row/(j−1)-th column, i-th row/(j−2)-th column, and (i−2)th row/j-th column of the reference matrix.

15. The apparatus according to claim 11, wherein defining a set of values which matrix components of the reference matrix are configured to take as $\Psi$, the number of elements of $\Psi$ as $|\Psi|$, $\Psi=\{0, 1, \ldots, |\Psi|-1\}$, a total set of integers as Z, and a set of matrix components equal in distance from the i-th row/j-th column component of the reference matrix as $$G=\{y_g \epsilon \Psi | g \epsilon Z,\ 0 \leq g \leq |G|-1\}$$

where $|G|$ is the number of elements of the set G, the classifier converts a matrix component contained in the set G into a symbol given by $$\sum_{g=0}^{|G|-1} y_g.$$

16. The apparatus according to claim 11, wherein defining a set of values which matrix components of the reference matrix are configured to take as $\Psi$, the number of elements of $\Psi$ as $|\Psi|$, $\Psi=\{0, 1, \ldots, |\Psi|-1\}$, a total set of integers as Z, and a set of matrix components equal in distance from the i-th row/j-th column component of the reference matrix as $$G=\{y_g \epsilon \Psi | g \epsilon Z,\ 0 \leq g \leq |G|-1\}$$

where $|G|$ is the number of elements of the set G, the classifier converts a matrix component contained in the set G into a symbol given by $$\sum_{g=0}^{|G|-1} y_g |\Psi|^g.$$

17. The apparatus according to claim 11, wherein the context tree has a depth equal to the number of sets generated by the classifier.

18. The apparatus according to claim 11, wherein the context tree makes an internal node at a shallower position have one-to-one correspondence with a matrix component of, a set generated by the classifier, which is nearer the i-th row/j-th column component of the reference matrix.

* * * * *